United States Patent [19]
Nakase

[11] Patent Number: 5,621,693
[45] Date of Patent: Apr. 15, 1997

[54] SEMICONDUCTOR MEMORY DEVICE

[75] Inventor: Yasunobu Nakase, Tokyo, Japan

[73] Assignee: Mitsubishi Denki Kabushiki Kaisha, Tokyo, Japan

[21] Appl. No.: 632,147

[22] Filed: Apr. 15, 1996

[30] Foreign Application Priority Data

Oct. 24, 1995 [JP] Japan .................................. 7-275245

[51] Int. Cl.$^6$ .................................................. G11C 7/00
[52] U.S. Cl. ......................... 365/227; 365/156; 365/190; 365/203; 365/207
[58] Field of Search .................................. 365/227, 203, 365/156, 190, 207

[56] References Cited

U.S. PATENT DOCUMENTS

| | | | |
|---|---|---|---|
| 4,768,166 | 8/1988 | Anami | 365/154 |
| 5,392,249 | 2/1995 | Kan | 365/190 X |
| 5,539,691 | 7/1996 | Kozaru et al. | 365/190 X |

OTHER PUBLICATIONS

Fundamentals of MOS Digital Integrated Circuits, p. 366, 1988, John P. Uyemura, "TG Logic Implementation".

1995 Symposium on VLSI Circuits Digest of Technical Papers, pp. 25–26, 1995, Hiroyuki Mizuno, et al., "Driving Source–Line (DSL) Cell Architecture Sub–1–V High–Speed Low–Power Applications".

1993 IEEE International Solid–State Circuits Conference, pp. 252–253, Feb. 26, 1993, Motomu Ukita, et al., "A Single Bitline Cross–Point Cell Activation (SCPA) Architecture for Ultra Low Power SRAMs".

*Primary Examiner*—Do Hyun Yoo
*Attorney, Agent, or Firm*—Oblon, Spivak, McClelland, Maier & Neustadt, P.C.

[57] ABSTRACT

A power source potential VDD and a ground potential GND are supplied to a memory cell which belongs to a selected column. The power source potential VDD and an intermediate potential $V_p$ are supplied to a memory cell which belongs to a non-selected column. Even if an access transistor of the memory cell which belongs to a selected word line and the non-selected column conducts, a current which flows in a drive transistor is suppressed.

17 Claims, 8 Drawing Sheets

SEMICONDUCTOR MEMORY DEVICE

BACKGROUND OF THE INVENTION

1. Field of the Invention

The present invention relates to a technique for reducing consumption power in a semiconductor static RAM of a clock-synchronized type.

2. Description of the Background Art

Figure 7:
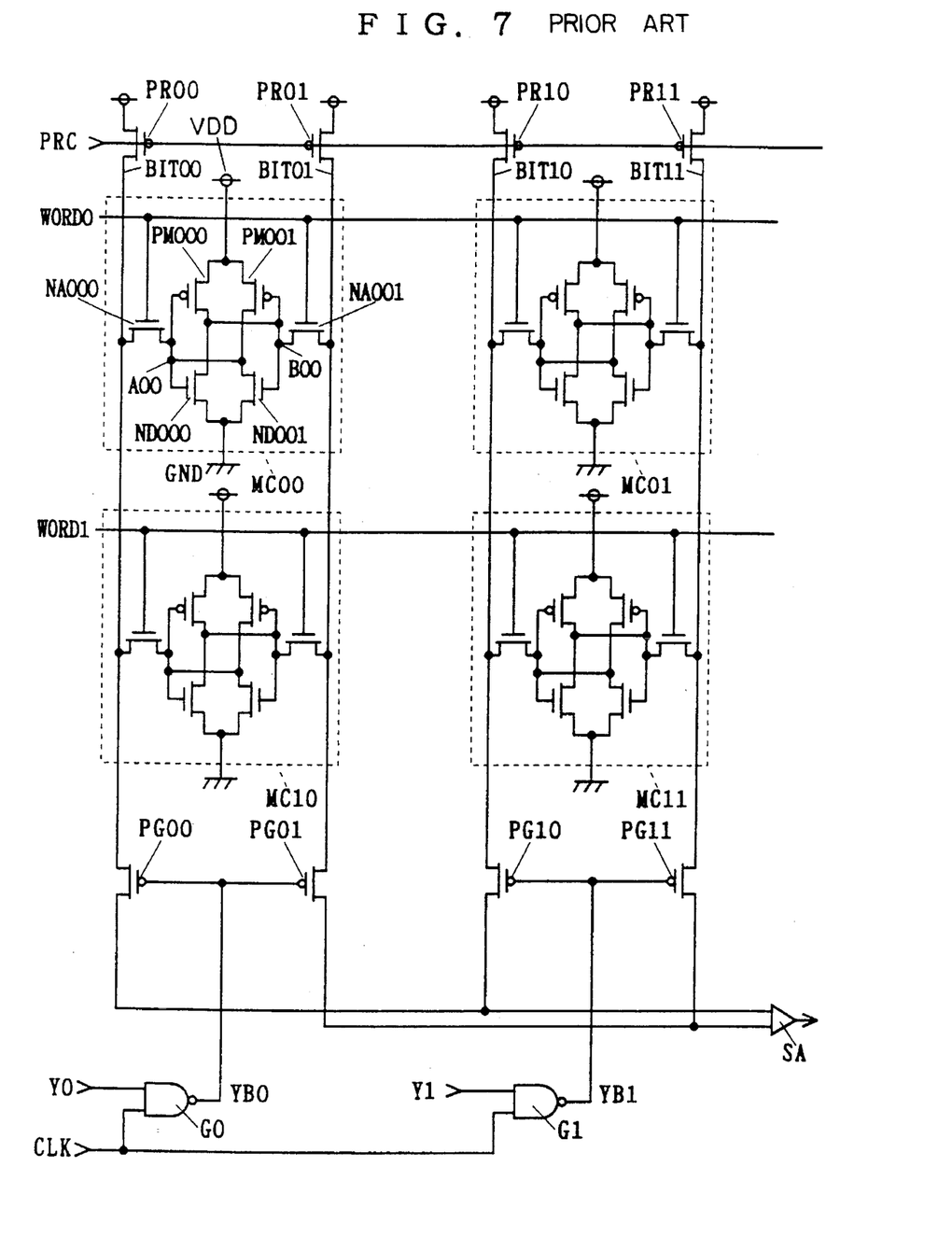
FIG. 7 is a circuitry diagram showing a structure according to a conventional technique.

FIG. 7 is a circuitry diagram showing a portion of a semiconductor static RAM (hereinafter "SRAM")of a clock-synchronized type, having a conventional structure. For simplicity, FIG. 7 shows only two word lines WORD0 and WORD 1 and two bit line pairs (BIT00, BIT01) and (BIT10, BIT11). Further, also for simplicity, FIG. 7 shows only two memory cells for each one of the word lines and the bit line pairs, i.e., MC00, MC01, MC10 and MC11, although a number of memory cells are disposed for each one of the word lines and the bit line pairs in reality.

Each memory cell MCij (i=0, 1; j=0, 1) is formed by six transistors, namely, PMOS transistors PMij0, PMij1 which serve as load transistors, NMOS transistors NAij0, NAij1 which serve as access transistors, NMOS transistors NDij0, NDij1 which serve as drive transistors. In FIG. 7, reference characters are allotted to the transistors which are included in the memory cell MC00 alone, for simplicity of illustration.

A power source potential VDD is supplied to sources of the PMOS transistors PMij0, PMij1, while a ground potential GND is supplied to sources of the NMOS transistors NDij0, NDij1.

At a node Aij, a gate of the load transistor PMij0, a gate of the drive transistor NDij0, a drain of the load transistor PMij1, and a drain of the drive transistor NDij1 are connected in common. At a node Bij, a gate of the load transistor PMij1, a gate of the drive transistor NDij1, a drain of the load transistor PMij0, and a drain of the drive transistor NDij0 are connected in common.

Data are stored in the memory cell MCij when the nodes Aij and Bij receive mutually exclusive logic. The node Aij is connected to a bit line BITj0 through the access transistor NAij0, and the node Bij is connected to a bit line BITj1 through the access transistor NAij1.

Figure 8:
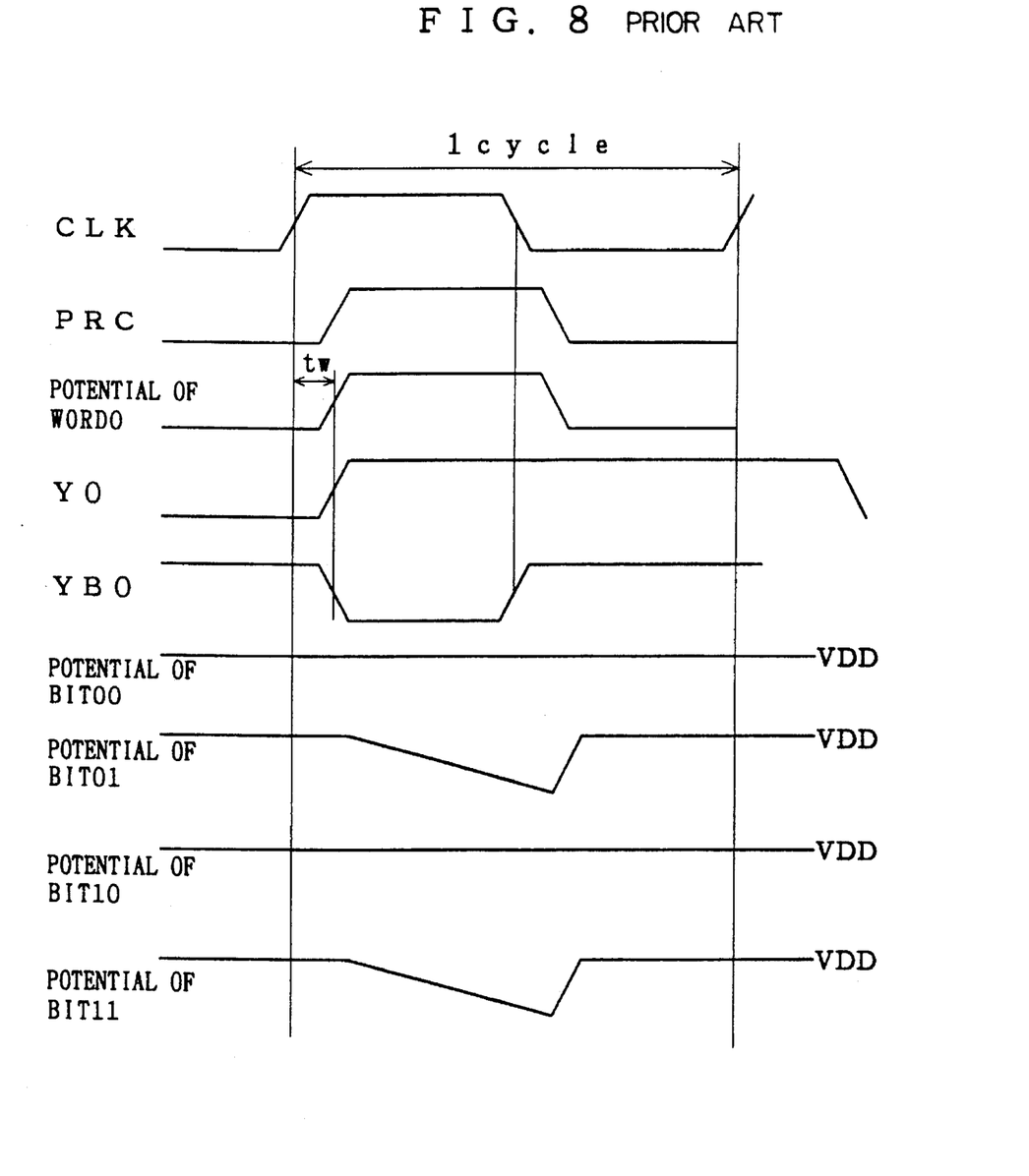
FIG. 8 is a flow chart showing an operation in the conventional technique.

FIG. 8 is a timing chart showing reading from the memory cell MC00 which is shown in FIG. 7. As herein defined, the "H" level is the power source potential VDD, and the "L" level is the ground potential GND.

The reading operation starts at a leading edge of a clock signal CLK. Delayed from the leading edge of the clock signal CLK by a time tw which is necessary for a column address signal to be decoded, an original column select signal Y0 rises. An inverted logical product of the column select signal Y0 and the clock signal CLK is created at an NAND gate G0, whereby a column select signal YB0 falls. This conducts PMOS transistors, or gate transistors, PG00 and PG01, and allows the bit lines BIT00 and BIT01 of one bit line pair to be connected to a sense amplifier SA (bit line select state).

Further, delayed from the leading edge of the clock signal CLK by the time tw which is necessary for the column address signal to be decoded, a potential at the word line WORD0 rises (i.e., the word line WORD0 is selected).

A precharge signal PRC stays at the low level until a word line is selected. When a PMOS transistor PRij to which the precharge signal PRC is supplied is conducted, each bit line is precharged to the power source potential VDD.

Now, assuming that the "H" level is maintained at an node A00 and the "L" level is maintained at an node B00 in the memory cell MC00, drive transistors ND000 and ND001 remain conductive and non-conductive, respectively.

When the word line WORD0 is selected (i.e., when a potential at the word line WORD0 rises), the precharge signal PRC rises and precharging is stopped. Meanwhile, a charge in the bit line BIT01 is discharged from an access transistor NA001 through the drive transistor ND000. Hence, the potential at the bit line BIT01 starts falling down from the "H" level to the "L" level. On the other hand, since an access transistor NA000 does not carry a current because the dive transistor ND001 is not conducting, a potential at the bit line BIT00 remains at "H" level.

The column select signal YB0 then switches to the low level, so that the gate transistors PG00 and PG01 are conducted. As a result, the sense amplifier SA detects a difference between the potentials on the bit lines BIT00 and BIT01 of one bit line pair, which in turn allows the data which are stored in the memory cell MC00 to be retrieved.

Following this, the word lines and the bit lines are switched to the non-conductive condition, in response to falling of the clock signal CLK. In addition, the precharge signal PRC falls and the PMOS transistors PRij initialize all bit line to the "H" level, thereby completing the reading operation.

Since precharging is performed on all bit lines, when a potential at the word line WORD0 is changed to the "H" level, a current flows from the access transistor NA0j1 to the drive transistor ND0j0 or from the access transistor NA0j0 to the drive transistor ND0j1 in each one of the memory cells MC0j.

However, to obtain data from the sense amplifier SA, it is necessary to select only one bit line pair, rather than selecting a plurality of bit lines. For instance, in the example described with reference to FIG. 8, the column select signal YB0 falls so as to obtain the data which are stored in the memory cell MC00 from the sense amplifier SA. A column select signal YB1 never falls at this stage. That is, a potential difference between the bit lines BIT10 and BIT11 is not detected.

Hence, a current which flows in such an occasion in the memory cell MC01 because of the access transistors and the drive transistors does not contribute to reading of data, and therefore, is not necessary. In other words, such a current which is not needed for a desired operation disadvantageously increases consumption of a current.

Such an unnecessary current increases as the number of columns (i.e., the number of the bit line pairs) which share the same one sense amplifier SA increases. For example, where a current of 0.1 mA flows during reading from one memory cell and the number of the columns which share the same sense amplifier is 64, although a current which is necessary for the reading operation is 0.1 mA, a current of 6.4 mA flows in reality.

SUMMARY OF THE INVENTION

A first aspect of the present invention is directed to a semiconductor memory device, comprising: (a) a plurality of memory cells which are arranged in a matrix of rows and columns, each of the rows to which each memory cell belongs being determined when one of a plurality of word lines is selected, each of the columns to which each memory cell belongs being determined when one of a plurality of bit line pairs is selected in response to original column select signals which are activated mutually exclusively from each other, each of the memory cells comprising: (a-1) a first information holding node and a second information holding node which receive mutually exclusive logic; (a-2) a power source input terminal; (a-3) a first switch which makes a condition between a first bit line of one of the bit line pairs and the first information holding node conductive or non-conductive in accordance with whether one of the plurality of word lines which corresponds to one of the rows to which each memory cell belongs is selected or not selected; (a-4) a second switch which makes a condition between a second bit line of the one of the bit line pairs and the second information holding node conductive or non-conductive in accordance with whether the one of the plurality of word lines is selected or not selected; (a-5) a first load having one end which is connected to the second information holding node and the another end for receiving a first potential; (a-6) a second load having one end which is connected to the first information holding node and the another end for receiving the first potential; (a-7) a first drive transistor having a gate connected to the first information holding node, a drain connected to the second information holding node, and a source connected to the power source input terminal; and (a-8) a second drive transistor having a gate connected to the second information holding node, a drain connected to the first information holding node, and a source connected to the power source input terminal; (b) power save circuits which are disposed to correspond to the columns, respectively, each comprising: (b-1) an input terminal for receiving an associated one of the original column select signals which corresponds to an associated one of the columns; and (b-2) an output terminal for outputting a second potential, which is different from the first potential, to the power source input terminal of every one of the memory cells which belong to the associated one of the columns, when the associated one of the original column select signals is active, the output terminal outputting a third potential, which is between the first and the second potentials, to the power source input terminal of every one of the memory cells which belong to the associated one of the columns, when the associated one of the original column select signals is not active; (c) a sense amplifier; and (d) bit line connecting means which are disposed to correspond to the columns, respectively, each receiving the associated one of the original column select signals which corresponds to the associated one of the columns and a clock signal and connecting the sense amplifier to one of the bit line pairs only when the two signals are both active, wherein the bit line pairs are precharged to the first potential when the first and the second switches are non-conductive.

According to a second aspect of the present invention, in the semiconductor memory device of the first aspect, the second potential is supplied to back gates of both the first drive transistor and the second drive transistor.

According to a third aspect of the present invention, in the semiconductor memory device of the first aspect, each one of the power save circuits further comprises: (b-3) a first switch having one end receiving the second potential and the another end which is connected to the output terminal of each one of the power save circuits, the first switch conducting the one end and the another end thereof when the associated one of the;original column select signals is activated; and (b-4) a second switch having one end receiving the third potential and the another end which is connected to the output terminal of each one of the power save circuits, the second switch conducting the one end and the another end thereof when the associated one of the original column select signals is not activated.

According to a fourth aspect of the present invention, the semiconductor memory device of the fifth aspect, further comprises (e) a plurality of MOS transistors which are connected in series to each other between the another ends of the second switches of the power save circuits and a potential point for receiving the second potential, wherein a gate and a drain are connected in common in each one of the plurality of MOS transistors.

According to a fifth aspect of the present invention, the semiconductor memory device of the fourth aspect, further comprises (f) connection lines which are disposed to correspond to the columns, respectively, each having a parasitic capacitance and each connecting the output terminal of an associated one of the power save circuits and every power source input terminal of all of the memory cells which belong to the associated one of the columns.

A sixth aspect of the present invention is directed to a semiconductor memory device, comprising: (a) a plurality of memory cells which are arranged in a matrix of rows and columns, one of the rows to which each memory cell belongs being determined when one of a plurality of word lines is selected, each of the columns to which each memory cell belongs being determined when one of a plurality of bit line pairs is selected in response to original column select signals which are activated mutually exclusively from each other, each one of the memory cells comprising: (a-1) a first information holding node and a second information holding node which receive mutually exclusive logic; (a-2) a power source input terminal; (a-3) a first switch which makes a condition between a first bit line of one of the bit line pairs and the first information holding node conductive or non-conductive in accordance with whether one of the plurality of word lines which corresponds to one of the rows to which each memory cell belongs is selected or not selected; (a-4) a second switch which makes a condition between a second bit line of the one of the bit line pairs and the second information holding node conductive or non-conductive in accordance with whether the one of the plurality of word lines is selected or not selected; (a-5) a first load having one end which is connected to the second information holding node and the another end for receiving a first potential; (a-6) a second load having one end which is connected to the first information holding node and the another end for receiving the first potential; (a-7) a first drive transistor having a gate connected to the first information holding node, a drain connected to the second information holding node, and a source connected to the power source input terminal; and (a-8) a second drive transistor having a gate connected to the second information holding node, a drain connected to the first information holding node, and a source connected to the power source input terminal; (b) power save circuits which are disposed to correspond to the columns, respectively, each comprising: (b-1) a first input terminal for receiving an associated one of the original column select signals which corresponds to an associated one of the columns; (b-2) a second input terminal for receiving a control signal; and (b-3) an output terminal fir outputting a second potential, which is different from the first potential, to the power source input terminal of every one of the memory cells which belong to the associated one of the columns, when the control signal is not activated but the associated one of the original column select signals is active, the output terminal outputting a third potential, which is between the first and the second potentials, to the power source input terminal of every one of the memory cells which belong to the associated one of the columns, when the control signal is not activated and the associated one of the original column select signals is not active, the output terminal outputting the second potential to the power source input terminal of every one of the memory cells which belong to the associated one of the columns, regardless of whether the associated one of the original column select signals is active or not active, when the control signal is activated, wherein the bit line pairs are precharged to the first potential when the first and the second switches are non-conductive.

According to a seventh aspect of the present invention, in the semiconductor memory device of the sixth aspect, the second potential is supplied to back gates of both the first drive transistor and the second drive transistor.

According to an eighth aspect of the present invention, in the semiconductor memory device of the sixth aspect, each one of the power save circuits further comprises: (b-4) a first switch having one end receiving the second potential and the another end which is connected to the output terminal of each power save circuit, the first switch conducting the one end and the another end thereof when the associated one of the original column select signals or the control signal is activated; and (b-5) a second switch having one end receiving the third potential and the another end which is connected to the output terminal of each power save circuit, the second switch conducting the one end and the another end thereof when both the associated one of the original column select signals and the control signal are not activated.

According to a ninth aspect of the present invention, the semiconductor memory device of the eighth aspect further comprises (c) a plurality of MOS transistors which are connected in series to each other between the another ends of the second switches of the power save circuits and a potential point for receiving the second potential, wherein a gate and a drain are connected in common in each one of the plurality of MOS transistors.

According to a tenth aspect of the present invention, the semiconductor memory device of the ninth aspect further comprises (d) connection lines which are disposed to correspond to the columns, respectively, each having a parasitic capacitance and each connecting the output terminal of an associated one of the power save circuits and every power source input terminal of all of the memory cells which belong to the associated one of the columns.

According to an eleventh aspect of the present invention, the semiconductor memory device of the sixth aspect further comprises: (c) a sense amplifier; and (d) bit line connecting means which are disposed to correspond to the columns, respectively, each receiving the associated one of the original column select signals which corresponds to the associated one of the columns and a clock signal and connecting the sense amplifier to one of the bit line pairs only when the two signals are both active.

Accordingly, an object of the present invention is to make it less easier for a current to flow in a memory cell which belongs to a non-selected column, and hence, to reduce consumption of a current without deteriorating the operation speed of an SRAM.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
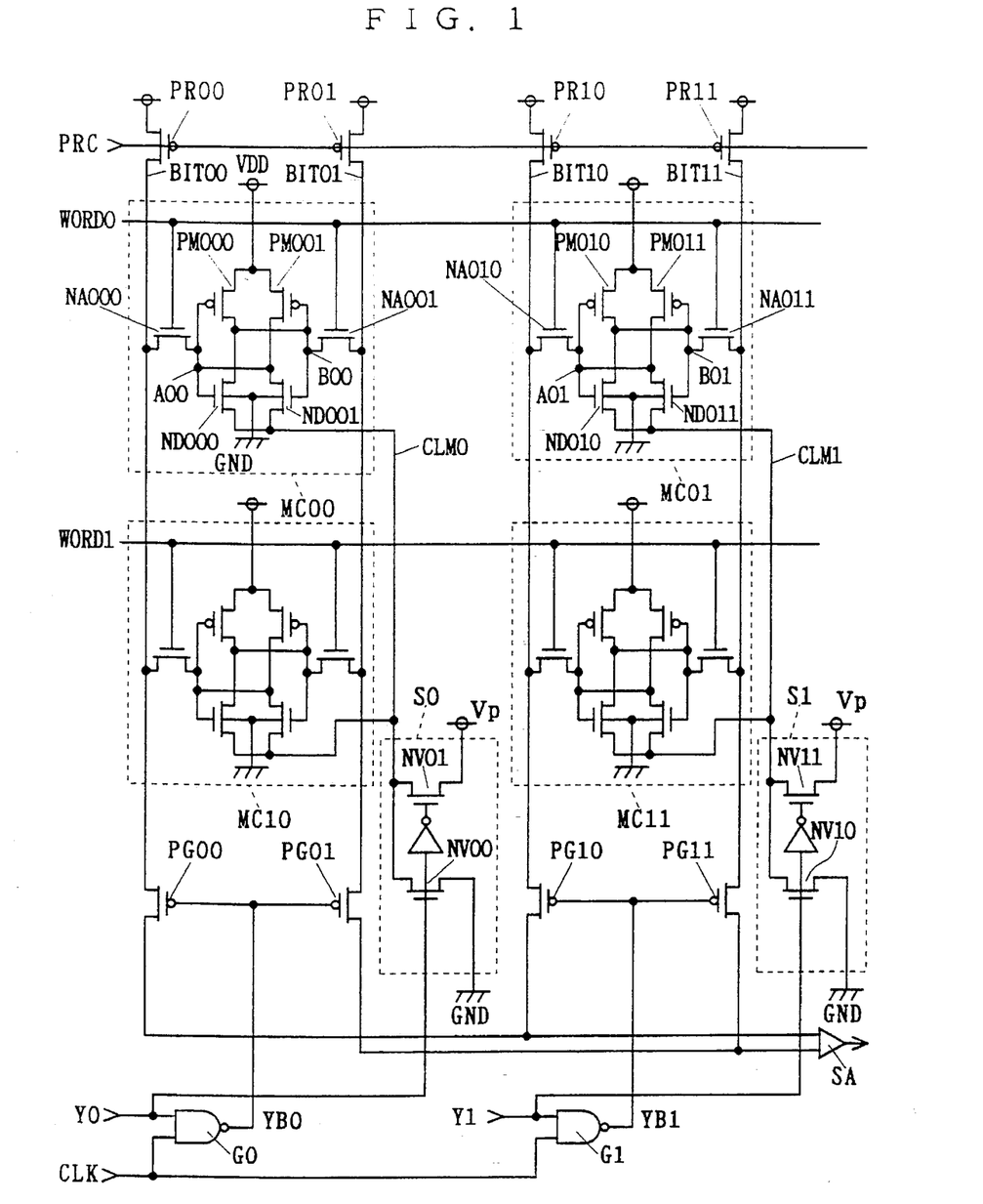
FIG. 1 is a circuitry diagram showing a structure according to a first preferred embodiment of the present invention.

FIG. 1 is a circuitry diagram partially showing a structure of an SRAM according to a first preferred embodiment of the present invention. In the following, the symbols i and j each denote a positive integer. For simplicity of illustration, FIG. 1 shows only a portion which corresponds to a case in which the symbols i and j are either one of the two values 0 and 1.

A memory cell MCij is disposed at an intersection of a word line WORDi and a bit line pair BITj0, BITj1. The bit lines BITj0 and BITj1 are connected to a potential point at which a power source potential VDD is supplied, through PMOS transistors PRj0 and PRj1, respectively. Further, the bit lines BITj0 and BITj1 are connected to input terminals of a sense amplifier SA, respectively through PMOS transistors PGj0 and PGj1 which serve as gate transistors.

A precharge signal PRC is supplied commonly to gates of the PMOS transistors PRj0 and PRj1, regardless of the value of the symbol j. A column select signal YBj is supplied commonly to gates of the PMOS transistors PGj0 and PGj1. The column select signal YBj is generated by an NAND gate Gj, as an inverted logical product of an original column select signal Yj and a clock signal CLK.

The memory cell MCij comprises PMOS transistors PMij0 and PMij1 which serve as a first load transistor and a second load transistor, NMOS transistors NDij0 and NDij1 which serve as a first drive transistor and a second drive transistor, and NMOS transistors NAij0 and NAij1 which serve as a first access transistor and a second access transistor.

The power source potential VDD is supplied commonly to a source of the first load transistor PMij0 and a source of the second load transistor PMij1.

At an node Aij, a gate of the first load transistor PMij0, a gate of the first drive transistor NDij0, a drain of the second load transistor PMij1, and a drain of the second drive transistor NDij1 are connected in common. At a node Bij, a gate of the second load transistor PMij1, a gate of the second drive transistor NDij1, a drain of the first load transistor PMij0, and a drain of the first drive transistor NDij0 are connected in common.

The node Aij is connected to the bit line BITj0 through the first access transistor NAij0, and the node Bij is connected to the bit line BITj1 through the second access transistor NAij1. Gates of the first and the second access transistors NAij0 and NAij1 are both connected to the word line WORDi.

A connection line CLMj is connected commonly to the drain of the first drive transistor NDij0 and the second drive transistor NDij1, regardless of the value of the symbol i. A ground potential GND is supplied to back gates of the first and the second drive transistors NDij0 and NDij1.

A power save circuit Sj comprises NMOS transistors NVj0 and NVj1. The original column select signal Yj and a potential which corresponds to inverted logic of the same are supplied to gates of the NMOS transistors NVj1 and NVj1, respectively. Drains of the NMOS transistors NVj0 and NVj1 are commonly connected to the connection line CLMj. The ground potential GND is supplied to a source of the NMOS transistor NVj0, while an intermediate potential $V_p$ is supplied to a source of the NMOS transistor NVj1. The intermediate potential $V_p$ is higher than the ground potential GND but is lower than the power source potential VDD.

Figure 2:
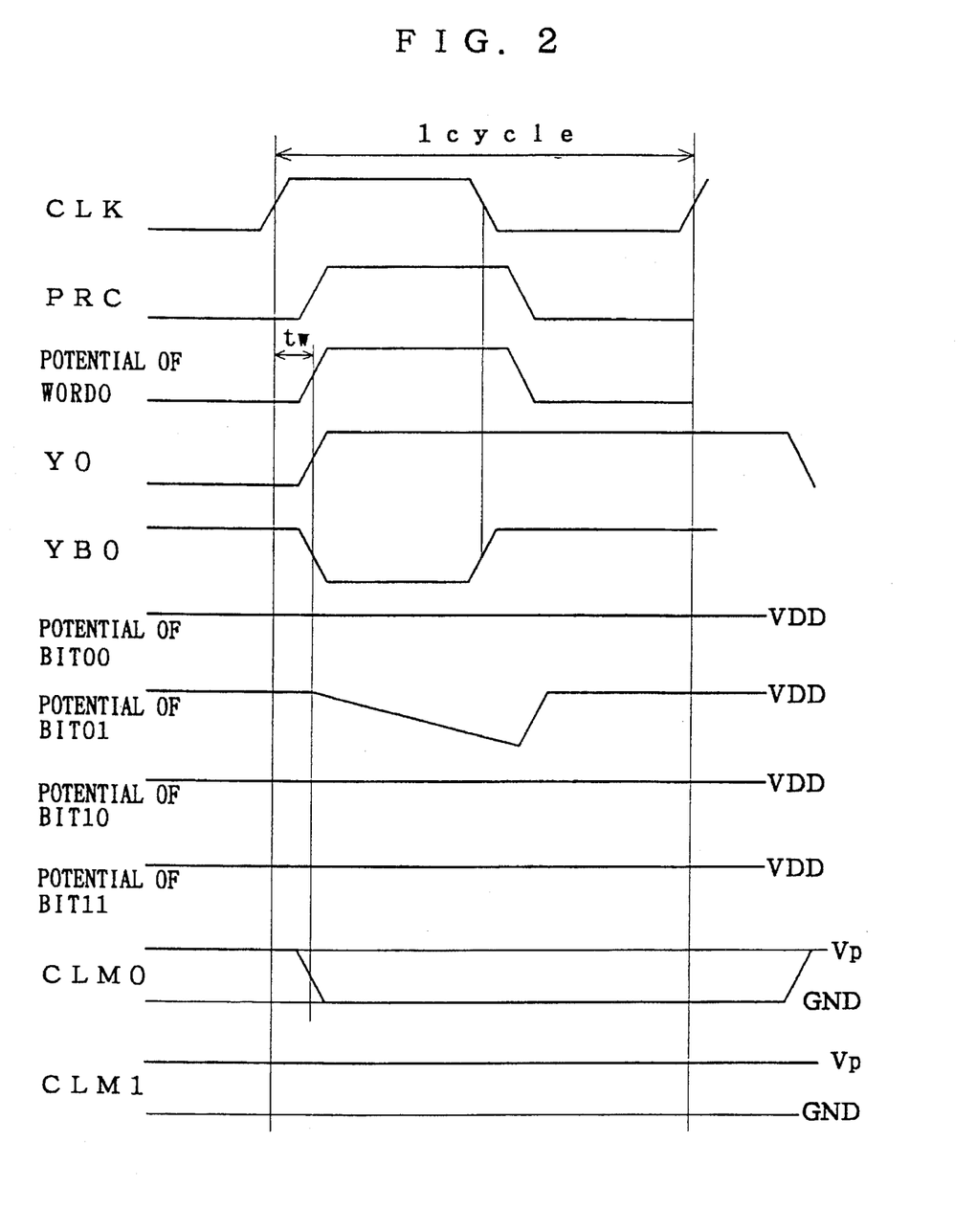
FIG. 2 is a timing chart showing an operation in the first preferred embodiment of the present invention.

FIG. 2 is a timing chart showing reading from a memory cell MC00. Time is measured along a horizontal axis and a potential is measured along a vertical axis. The reading operation starts at a leading edge of the clock signal CLK. Delayed from the leading edge of the clock signal CLK by a time tw which is necessary for a column address signal to be decoded, an original column select signal Y0 rises. An original column select signal Y1 which corresponds to a non-selected column does not rise. An inverted logical product of the column select signal Y0 and the clock signal CLK is created at an NAND gate G0, whereby a column select signal YB0 falls. This conducts PMOS transistors, or gate transistors, PG00 and PG01, and allows the bit lines BIT00 and BIT01 of one bit line pair to be connected to the sense amplifier SA (bit line select state).

A row address signal is decoded and the potential at the word line WORD0 rises (i.e., the word line WORD0 is selected). If an appropriate delaying element is disposed, the potential at the word line WORD0 rises, delayed by the time tw from rising of the clock signal CLK.

The precharge signal PRC stays at the low level until any one of the word lines is selected. When a PMOS transistor PRij to which the precharge signal PRC is supplied is conducted, each bit line is precharged to the power source potential VDD.

Since NMOS transistors NV00 and NV01 are in a non-conductive condition and a conductive condition, respectively, until the column select signal Y0 rises, the intermediate potential $V_p$ is supplied to a connection line CLM0. The intermediate potential $V_p$ is supplied to a connection line CLM1 as well, in a similar manner.

When the nodes Aij and Bij receive mutually exclusive logic while the first and the second access transistors NAij0 and NAij1 are in the non-conductive condition (i.e., when a word line WORDi is not selected), data are held in the memory cell MCij. Now, it is assumed that a potential at the node Aij is the power source potential VDD and therefore a logical "H" level is held. Under such a condition, the first load transistor PMij0 and the first drive transistor NDij0 are in the non-conductive condition and the conductive condition, respectively, and the intermediate potential $V_p$ is supplied to the node Bij through the first drive transistor NDij0. Since this allows the intermediate potential $V_p$ to be supplied to both the gate and the source of the second drive transistor NDij1, the second drive transistor NDij1 enters the non-conductive condition. That is, logic "L" is supplied to the node Bij, because of the intermediate potential $V_p$. Therefore, if the value of a voltage (VDD–$V_p$) is set larger than an absolute value VtM of a threshold value for the second load transistor PMij1, the second load transistor PMij1 remains conductive, the node Aij is kept at the potential VDD, and the logic "H" is maintained.

The original column select signal Y0 rises, and therefore, the NMOS transistor NV00 becomes conductive and the NMOS transistor NV01 becomes non-conductive. Since this supplies the ground potential GND to the connection line CLM0 through the NMOS transistor NV00, it is possible to read from the memory cell MC00 as in the conventional technique. In other words, the column select signal YB0 falls and the precharge signal PRC rises, thereby connecting the bit lines BIT00 and BIT01 to the sense amplifier SA through the gate transistors PG00 and PG01, respectively. As a result, a precharged electric charge flows in either one of the first and the second access transistors NA000 and NA001 which are conducted by rise of the potential at the word line WORD0.

Such a flow of an electric charge is suppressed in the memory cell MC01 which does not belong to the selected column. The reason is as described below.

Since the original column select signal Y1 remains at the "L" level, an NMOS transistor NV11 is conducting, an NMOS transistor NV10 remains non-conductive, and the intermediate potential $V_p$ is supplied to the connection line CLM1, in a power save circuit S1.

Now, it is assumed that an node A01 and an node B01 are at the "H" level and the "L" level, respectively, in the memory cell MC01. Although a first drive transistor ND010 is conductive, since a source of the first drive transistor ND010 is at the intermediate potential $V_p$, a potential difference between a gate and the source in the first drive transistor ND010 is VDD–$V_p$. Further, since the ground potential GND is supplied to a back gate of the first drive transistor ND010, a threshold voltage VtD of the first drive transistor ND010 increases due to a back gate effect. Hence, it is possible to set a current which flows in the first drive transistor ND010 smaller than in the conventional technique.

While the value of a current which flows in the first drive transistor ND010 becomes smaller as the intermediate potential $V_p$ is larger, if the intermediate potential $V_p$ is set too large, the value of a voltage (VDD–$V_p$) becomes smaller than the absolute value VtM of a threshold value for a second load transistor PM011, which in turn makes it impossible to conduct the second load transistor PM011. Hence, it is impossible to maintain data "H" at the node Aij although the data "H" need be maintained at the node Aij. For instance, assuming that the power source potential VDD is 3 V, if the intermediate potential $V_p$ is set 1.5 V, the value of a current which flows in a non-selected memory cell becomes almost small enough compared with the value of a current which flows in a selected memory cell. As a result, it is possible to maintain the potential VDD (i.e., "H" level), almost without changing potentials on the bit lines BIT10 and BIT11 of a non-selected column.

The precharge signal PRC is generated by delaying the clock signal CLK by a predetermined delay time. A period during which the precharging is performed successively continues over half the cycle of the clock signal CLK. On the other hand, the column select signal YBj rises in response to falling of the clock signal CLK. Hence, if the gate transistors PGj0 and PGj1 are made conductive or non-conductive under the control of the column select signal YBj, input lines of the sense amplifier SA are prevented from getting precharged, and therefore, data to be detected are prevented from getting deleted.

However, it is not desirable to use the column select signal YBj to control conducting and non-conducting of the NMOS transistors NVj0 and NVj1 of the power save circuit Sj. When the same column is selected in the next cycle as well, it is not necessary to update a potential which is to be supplied to the connection line CLMj from the power save circuit Sj (i.e., the intermediate potential $V_p$ or the ground potential GND). Rather, the potential which is to be supplied to the connection line CLMj must not be changed unless otherwise needed. Since the connection line CLMj is connected to a number of memory cell in general, a parasitic capacitance of the connection line CLMj is large. Due to this, considering a reduction in power consumption, it is advantageous to avoid an unnecessary change in the potential as much as possible.

For this reason, the original column select signal Yj is used to control the power save circuit Sj. The original column select signal Yj does not change its value during one cycle of the clock signal CLK (although creating a delay time associated with decoding). This is because it is not necessary to update the value of the original column select signal Yj when the same column is to be selected in the next cycle as well.

Conversely, if the original column select signal Yj is used to control conducting and non-conducting of the gate transistors PGj0 and PGj1, a period is created in which the input terminals of the sense amplifier SA are precharged. This is not desirable since data will be deleted.

For the reasons described above, two types of signals, i.e., the original column select signal Yj and the column select signal YBj, are prepared to select the columns.

Thus, according to the present invention, it is possible to largely reduce a current which flows in a memory cell which does not belong to a selected column, and to suppress consumption of a current which is not related to a reading operation. In addition, since a current which flows in a memory cell which is related to the reading operation (i.e., which belongs to the selected column) remains the same as in the conventional technique, the speed of the SRAM does not deteriorate. Moreover, when other memory cell which belongs to the same column is selected subsequently, it is not necessary to switch the intermediate potential $V_p$ and the ground potential GND and supply one of the potentials to the memory cell, thereby further reducing consumption of a current.

Figure 3:
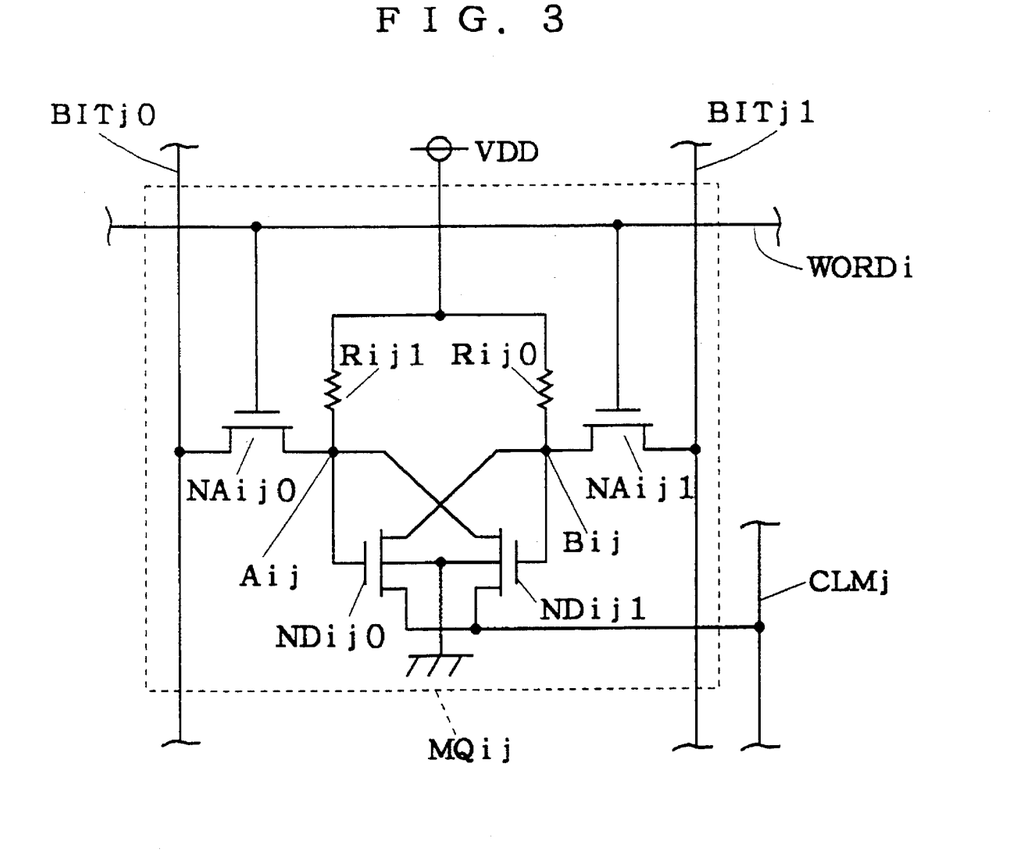
FIG. 3 is a circuitry diagram showing another structure according to the first preferred embodiment of the present invention.

FIG. 3 is a circuitry diagram showing a structure of a memory cell MQij in which a high resistance is used as a load. The memory cell MQij comprises resistors Rij0 and Rij1 which serve as a first load and a second load, NMOS transistors NDij0 and NDij1 which serve as a first drive transistor and a second drive transistor, and NMOS transistors NAij0 and NAij1 which serve as a first access transistor and a second access transistor.

The power source potential VDD is supplied commonly to one end of the first load resistance Rij0 and one end of the second load resistance Rij1. At the node Aij, the other end of the second load resistance Rij1, a gate of the first drive transistor NDij0, and a drain of the second drive transistor NDij1 are connected in common. At the node Bij, the other end of the first load resistance Rij0, a gate of the second drive transistor NDij1, and a drain of the first drive transistor NDij0 are connected in common.

The node Aij is connected to the bit line BITj0 through the access transistor NAij0, and the node Bij is connected to the bit line BITj1 through the access transistor NAij1. Gates of the access transistors NAij0 and NAij1 are both connected to the word line WORDi.

The connection line CLMj is connected commonly to the drain of the first drive transistor NDij0 and the second drive transistor NDij1, regardless of the value of the symbol i. The ground potential GND is supplied to back gates of the first and the second drive transistors NDij0 and NDij1. Clearly, the present invention is applicable to the memory cell MQij which has such a structure.

Second Preferred Embodiment

In a system which includes SRAMs, to suppress power consumption taken by the system, the power source potential VDD for an SRAM which will not be accessed for the time being is sometimes lowered (sleep mode). In the first preferred embodiment, an operating voltage of a memory cell which does not belong to a selected column is substantially (VDD–Vp). Hence, if the power source potential VDD is lowered, it may become impossible to maintain data in the memory cell. The second preferred embodiment uses a control signal HOLD so that an operating voltage of every memory cell is VDD.

Figure 4:
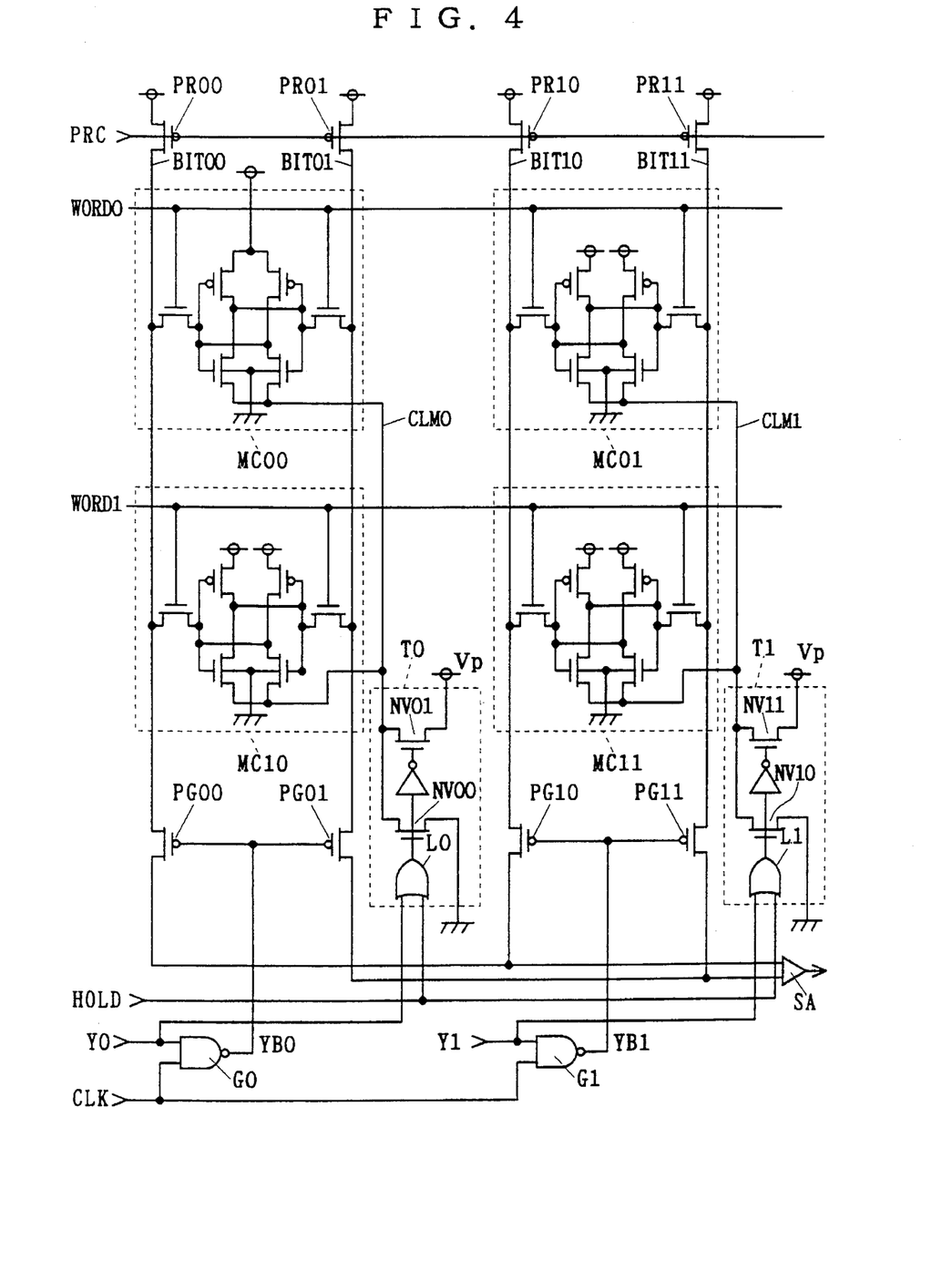
FIG. 4 is a circuitry diagram showing a structure according to a second preferred embodiment of the present invention.

FIG. 4 is a circuitry diagram partially showing a structure of an SRAM according to the second preferred embodiment of the present invention. A difference the structure according to the second preferred embodiment has against the structure according to the first preferred embodiment is that the power save circuit Sj is replaced with a power save circuit The power save circuit Tj is equivalent to the power save circuit Sj as it is modified to additionally comprise an OR gate Lj. That is, the OR gate Lj outputs a logical sum of the control signal HOLD and the original column select signal Yj, and supplies the logical sum to the gate of the NMOS transistor NVj0. Logic which is complementary to the logic which is supplied to the gate of the NMOS transistor NVj0 is supplied to the gate of the NMOS transistor NVj1.

When the control signal HOLD is at the "L" level, the circuit which is shown in FIG. 4 operates in a similar manner to the circuit which is shown in FIG. 1 of the first preferred embodiment of the present invention. On the other hand, when the signal HOLD is at the "H" level, the NMOS transistor NVj0 is allowed to conduct while the NMOS transistor NVj1 is not allowed to conduct, regardless of the value of the original column select signal Yj. Therefore, the ground potential GND is supplied to every connection line CLMj.

Thus, when the power source potential VDD for an SRAM is to be lowered in the sleep mode, the control signal HOLD is kept at the "H" level to supply the ground potential GND to the memory cell MCij, so that data in the memory cell MCij will not be destroyed.

Figure 5:
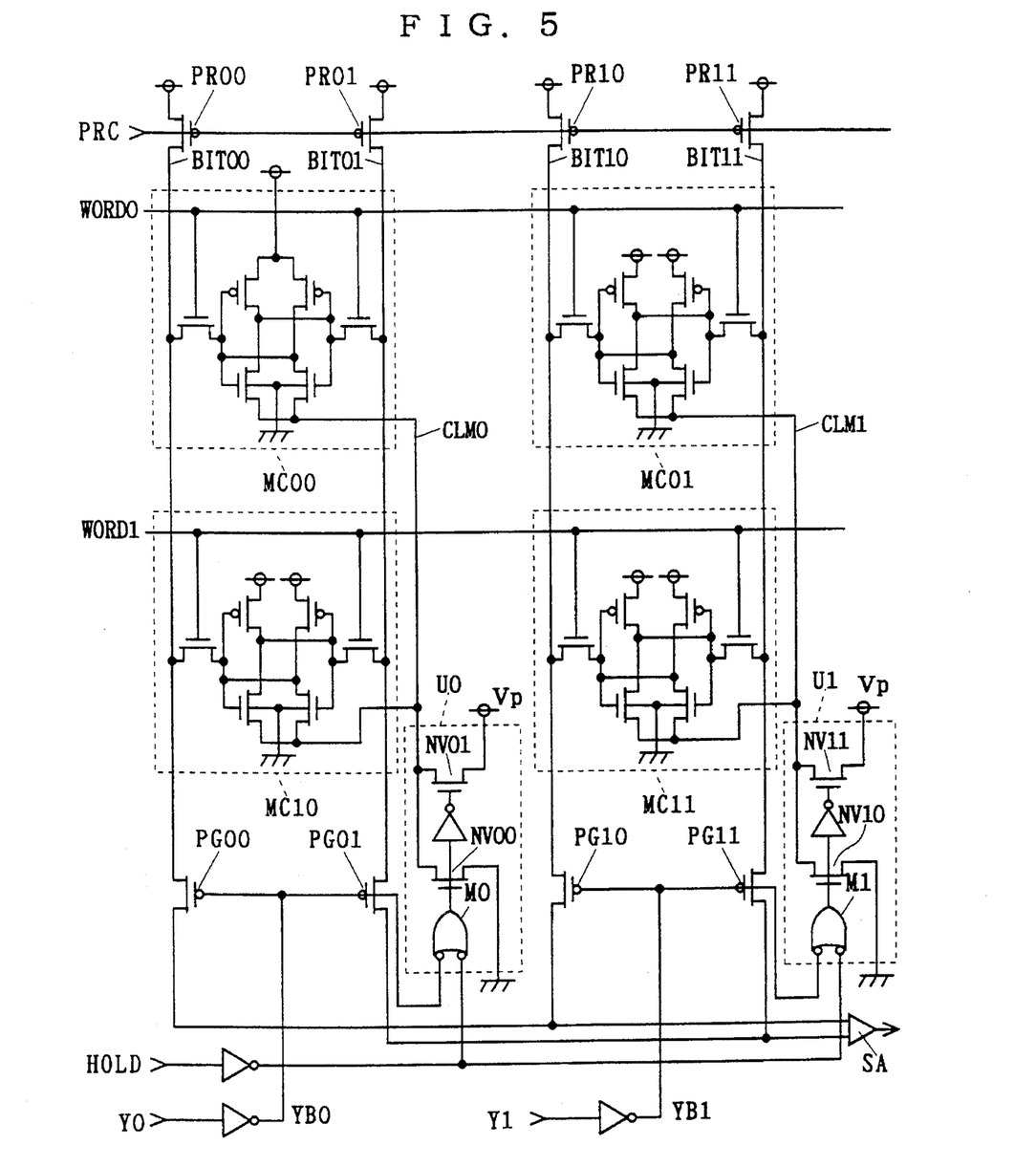
FIG. 5 is a circuitry diagram showing another structure according to the second preferred embodiment of the present invention.

If it is not necessary to synchronize an operation of the SRAM to the clock signal CLK, the gate Gj may be omitted. FIG. 5 is a circuitry diagram partially showing a modified structure of the SRAM according to the second preferred embodiment. The power save circuit Tj of FIG. 4 is replaced with a power save circuit Uj, an invertor is additionally disposed which inverts the original column select signal Yj to supply the inverted signal to the gates of the gate transistors PGj0 and PGj1, and further, an invertor is additionally disposed which inverts the control signal HOLD to supply the inverted signal to the power save circuit Uj.

The structure of the power save circuit Uj is equivalent to that of the power save circuit Tj as it is modified to replace the OR gate Lj with an NAND gate Mj. Since the NAND gate Mj creates a logical sum of inversion of the inverted original column select signal Yj (i.e., the original column select signal Yj as it is) and inversion of the inverted control signal HOLD (i.e., the control signal HOLD as it is), and outputs the logical sum, as in the case of FIG. 4, even if the power source potential VDD for an SRAM is to be lowered in the sleep mode, destruction of data in the memory cell MCij is prevented.

Third Preferred Embodiment

Of course, the intermediate potential Vp may be supplied from outside the SRAM, or may be generated within the SRAM. The latter approach allows the memory cell to omit an external pin through which the intermediate potential Vp is supplied, which in turn reduces the number of external pins.

Figure 6:
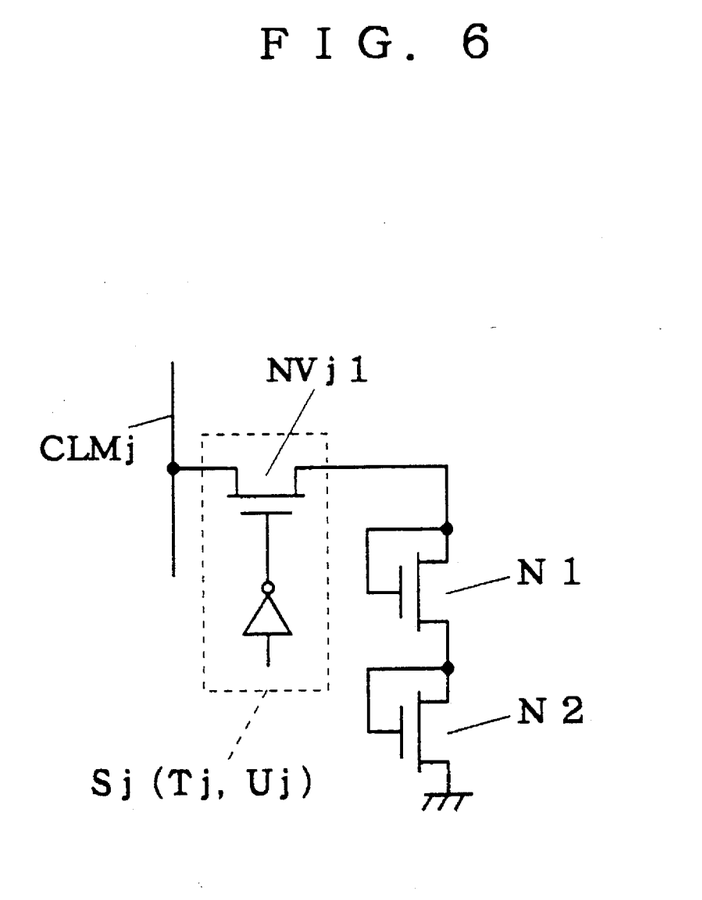
FIG. 6 is a circuitry diagram showing a structure according to a third preferred embodiment of the present invention.

FIG. 6 is a circuitry diagram showing a structure of a generation part which generates the intermediate potential Vp, according to a third preferred embodiment of the present invention. Through the NMOS transistor NVj1 of the power save circuit Sj (or Tj, Uj), NMOS transistors N1 and N2 each having gate-drain shorted are connected in series to each other between the connection line CLMj and the ground. Assuming that a threshold voltage of the NMOS transistors is Vth, the intermediate potential Vp of about 2 Vth can be generated. If Vth=0.6 V, Vp=1.2 V.

A premise for such generation of the intermediate potential Vp is that the NMOS transistors N1 and N2 are each carrying a current. However, once a current flows in the NMOS transistors N1 and N2 from either one of the bit lines BITj0 and BITj1 through the connection line CLMj, unless the ground potential GND is supplied to the connection line CLMj by the NMOS transistor NVj0, the intermediate potential Vp generated in this manner is maintained because of the parasitic capacitance of the connection line CLMj. Hence, even when there is no current flowing in the NMOS transistors N1 and N2, that is, even when a current is not supplied from the bit lines, since the intermediate potential Vp is supplied to the connection line CLMj, data in the memory cell MCij is held.

While the invention has been described in detail, the foregoing description is in all aspects illustrative and not restrictive. It is understood that numerous other modifications and variations can be devised without departing from the scope of the invention.

I claim:

1. A semiconductor memory device, comprising:
    (a) a plurality of memory cells which are arranged in a matrix of rows and columns, each of said rows to which each said plurality of memory cells belongs being determined when one of a plurality of word lines is selected, each of said plurality of columns to which each said memory cells belongs being determined when one of a plurality of bit line pairs is selected in response to original column select signals which are activated mutually exclusively from each other, each of said memory cells comprising:
        (a-1) a first information holding node and a second information holding node which receive mutually exclusive logic;
        (a-2) a power source input terminal;
        (a-3) a first switch which makes a condition between a first bit line of said one of said bit line pairs and said first information holding node conductive or non-conductive in accordance with whether said one of said plurality of word lines which corresponds to said each of said rows to which each said memory cells belongs is selected or not selected;
        (a-4) a second switch which makes a condition between a second bit line of said one of said bit line pairs and said second information holding node conductive or non-conductive in accordance with whether said one of said plurality of word lines is selected or not selected;
        (a-5) a first load having one end which is connected to said second information holding node and the another end for receiving a first potential;
        (a-6) a second load having one end which is connected to said first information holding node and the another end for receiving said first potential;
        (a-7) a first drive transistor having a gate connected to said first information holding node, a drain connected to said second information holding node, and a source connected to said power source input terminal; and
        (a-8) a second drive transistor having a gate connected to said second information holding node, a drain connected to said first information holding node, and a source connected to said power source input terminal;
    (b) power save circuits which are disposed to correspond to said columns, respectively, each comprising:
        (b-1) an input terminal for receiving an associated one of said original column select signals which corresponds to an associated one of said columns; and
        (b-2) an output terminal for outputting a second potential, which is different from said first potential, to said power source input terminal of every one of said memory cells which belong to said associated one of said columns, when said associated one of said original column select signals is active, said output terminal outputting a third potential, which is between said first and said second potentials, to said power source input terminal of every one of said memory cells which belong to said associated one of said columns, when said associated one of said original column select signals is not active;
    (c) a sense amplifier; and
    (d) bit line connecting means which are disposed to correspond to said columns, respectively, each receiving said associated one of said original column select signals which corresponds to said associated one of said columns and a clock signal and connecting said sense amplifier to said one of said bit line pairs only when the associated original column select signal and the clock signal are both active,
    wherein said bit line pairs are precharged to said first potential when said first and said second switches are non-conductive.

2. The semiconductor memory device of claim 1, wherein said first switch is a first access transistor having a gate connected to said one of said plurality of word lines and a current electrode pair consisting of two current electrodes, one connected to said first bit line and the other connected to said first information holding node,
    and wherein said second switch is a second access transistor having a gate connected to said one of said plurality of word lines and a current electrode pair consisting of two current electrodes, one connected to said second bit line and the other connected to said second information holding node.

3. The semiconductor memory device of claim 1, wherein said first load is a first load transistor of an opposite conductivity type to said first drive transistor, and said first load transistor has a drain connected to said second information holding node, a source for receiving said first potential and a gate connected to said first information holding node,
    and wherein said second load is a second load transistor of an opposite conductivity type to said second drive transistor, and said second load transistor has a drain connected to said first information holding node, a source for receiving said first potential and a gate connected to said second information holding node.

4. The semiconductor memory device of claim 1, wherein said second potential is supplied to back gates of both said first drive transistor and said second drive transistor.

5. The semiconductor memory device of claim 1, wherein each one of said power save circuits further comprises:
- (b-3) a first switch having one end receiving said second potential and the another end which is connected to said output terminal of said each one of said power save circuits, said first switch conducting said one end and said another end thereof when said associated one of said original column select signals is activated; and
- (b-4) a second switch having one end receiving said third potential and the another end which is connected to said output terminal of said each one of said power save circuits, said second switch conducting said one end and said another end thereof when the associated one of said original column select signals is not activated.

6. The semiconductor memory device of claim 5, wherein said each one of said power save circuits further comprises (b-5) an invertor having an input terminal connected to said input terminal of said each one of said power save circuits and an output terminal which inverts and outputs logic which is supplied to said input terminal of said invertor, said first switch of said each one of said power save circuits is a first transistor having a control electrode which is connected to said input terminal of said each one of said power save circuits, a first current electrode which is connected to said output terminal of said each one of said power save circuits, and a second current electrode for receiving said second potential, and wherein said second switch of said each one of said power save circuits is a second transistor having a control electrode which is connected to said output terminal of said invertor, a first current electrode which is connected to said output terminal of said each one of said power save circuits, and a second current electrode for receiving said third potential.

7. The semiconductor memory device of claim 5, further comprising (e) a plurality of MOS transistors which are connected in series to each other between said another ends of said second switches of said power save circuits and a potential point for receiving said second potential, wherein a gate and a drain are connected in common in each one of said plurality of MOS transistors.

8. The semiconductor memory device of claim 7, further comprising (f) connection lines which are disposed to correspond to said columns, respectively, each having a parasitic capacitance and each connecting said output terminal of an associated one of said power save circuits and every said power source input terminals of all of said memory cells which belong to said associated one of said columns.

9. A semiconductor memory device, comprising:
- (a) a plurality of memory cells which are arranged in a matrix of rows and columns, each of said rows to which each said memory cells belongs being determined when one of a plurality of word lines is selected, each of said columns to which each said plurality of memory cells belongs being determined when one of a plurality of bit line pairs is selected in response to original column select signals which are activated mutually exclusively from each other, each of said plurality of memory cells comprising:
  - (a-1) a first information holding node and a second information holding node which receive mutually exclusive logic;
  - (a-2) a power source input terminal;
  - (a-3) a first switch which makes a condition between a first bit line of said one of said bit line pairs and said first information holding node conductive or non-conductive in accordance with whether said one of said plurality of word lines which corresponds to one of said rows to which each said memory cells belongs is selected or not selected;
  - (a-4) a second switch which makes a condition between a second bit line of said one of said bit line pairs and said second information holding node conductive or non-conductive in accordance with whether said one of said plurality of word lines is selected or not selected;
  - (a-5) a first load having one end which is connected to said second information holding node and the another end for receiving a first potential;
  - (a-6) a second load having one end which is connected to said first information holding node and the another end for receiving said first potential;
  - (a-7) a first drive transistor having a gate connected to said first information holding node, a drain connected to said second information holding node, and a source connected to said power source input terminal; and
  - (a-8) a second drive transistor having a gate connected to said second information holding node, a drain connected to said first information holding node, and a source connected to said power source input terminal;
- (b) power save circuits which are disposed to correspond to said columns, respectively, each comprising:
  - (b-1) a first input terminal for receiving an associated one of said original column select signals which corresponds to an associated one of said columns;
  - (b-2) a second input terminal for receiving a control signal; and
  - (b-3) an output terminal for outputting a second potential, which is different from said first potential, to said power source input terminal of every one of said plurality of memory cells which belong to said associated one of said columns, when said control signal is not activated but said associated one of said original column select signals is active, said output terminal outputting a third potential, which is between said first and said second potentials, to said power source input terminal of every one of said plurality of memory cells which belong to said associated one of said columns, when said control signal is not activated and said associated one of said original column select signals is not active, said output terminal outputting said second potential to said power source input terminal of every one of said memory cells which belong to said associated one of said columns, regardless of whether said associated one of said original column select signals is active or not active, when said control signal is activated, wherein said bit line pairs are precharged to said first potential when said first and said second switches are non-conductive.

10. The semiconductor memory device of claim 9, wherein said first switch is a first access transistor having a gate connected to said one of said plurality of word lines and a current electrode pair consisting of two current electrodes, one connected to said first bit line and the other connected to said first information holding node, and wherein said second switch is a second access transistor having a gate connected to said one of said plurality of word lines and a current electrode pair consisting of two current electrodes, one connected to said second bit line and the other connected to said second information holding node.

11. The semiconductor memory device of claim 9, wherein said first load is a first load transistor of an opposite conductivity type to said first drive transistor, and said first load transistor has a drain connected to said second information holding node, a source for receiving said first potential and a gate connected to said first information holding node, and wherein said second load is a second load transistor of an opposite conductivity type to said second drive transistor, and said second load transistor has a drain connected to said first information holding node, a source for receiving said first potential and a gate connected to said second information holding node.

12. The semiconductor memory device of claim 9, wherein said second potential is supplied to back gates of both said first drive transistor and said second drive transistor.

13. The semiconductor memory device of claim 9, wherein each one of said power save circuits further comprises:

(b-4) a first switch having one end receiving said second potential and the another end which is connected to said output terminal of said each one of said power save circuits, said first switch conducting said one end and said another end thereof when said associated one of said original column select signals or said control signal is activated; and (b-5) a second switch having one end receiving said third potential and the another end which is connected to said output terminal of said each one of said power save circuits, said second switch conducting said one end and said another end thereof when both the associated one of said original column select signals and said control signal are not activated.

14. The semiconductor memory device of claim 13, wherein said each one of said power save circuits further comprises:

(b-6) a logic gate for outputting a logical sum of logic which is supplied to said first input terminal and logic which is supplied to said second input terminal; and (b-7) an invertor having an input terminal for receiving an output from said logic gate, and an output terminal for inverting and outputting logic which is supplied to said input terminal of said invertor, wherein said first switch of said each one of said power save circuits is a first transistor which has a control electrode for receiving said output from said logic gate, a first current electrode which is connected to said output terminal of said each one of said power save circuits, and a second current electrode for receiving said second potential, and wherein said second switch of said each one of said power save circuits is a second transistor which has a control electrode which is connected to said output terminal of said invertor, a first current electrode which is connected to said output terminal of said each one of said power save circuits, and a second current electrode for receiving said third potential.

15. The semiconductor memory device of claim 13, further comprising (c) a plurality of MOS transistors which are connected in series to each other between said another ends of said second switches of said power save circuits and a potential point for receiving said second potential, wherein a gate and a drain are connected in common in each one of said plurality of MOS transistors.

16. The semiconductor memory device of claim 15, further comprising (d) connection lines which are disposed to correspond to said columns, respectively, each having a parasitic capacitance and each connecting said output terminal of an associated one of said power save circuits and every said power source input terminals of all of said memory cells which belong to said associated one of said columns.

17. The semiconductor memory device of claim 9, further comprising:

(c) a sense amplifier; and (d) bit line connecting means which are disposed to correspond to said columns, respectively, each receiving the associated one of said original column select signals which corresponds to said associated one of said columns and a clock signal and connecting said sense amplifier to said one of said bit line pairs only when the associated original columns select signal and the clock signal are both active.

\* \* \* \* \*